(12) United States Patent
Ramprasad

(10) Patent No.: US 6,853,699 B1
(45) Date of Patent: Feb. 8, 2005

(54) HIGH SPEED SHIFTER CIRCUIT

(75) Inventor: Sumant Ramprasad, San Diego, CA (US)

(73) Assignee: Qualcomm, Incorporated, San Diego, CA (US)

(*) Notice: Subject to any disclaimer, the term of this patent is extended or adjusted under 35 U.S.C. 154(b) by 0 days.

(21) Appl. No.: 10/788,518

(22) Filed: Feb. 27, 2004

(51) Int. Cl.[7] .............................................. G11C 19/00
(52) U.S. Cl. ....................................................... 377/69
(58) Field of Search ........................................... 377/69

(56) References Cited

U.S. PATENT DOCUMENTS 6,064,714 A * 5/2000 Alidina et al. ................ 377/69

* cited by examiner

Primary Examiner—Margaret R. Wambach

(74) Attorney, Agent, or Firm—Philip R. Wadswoth; Charles D. Brown; Nicholas J. Pauley

(57) ABSTRACT

Systems and techniques are disclosed relating to shifting a plurality of input data bits to the left or right by a number of bit positions as a function of a binary value of a plurality of shift control bits. A first shifter element may be configured to perform one of two shifting operations on the input data bits to produce a plurality of first output bits, a first one of the shift control bits being used to select the shifting operation performed by the first shifter element. A second shifter element may be configured to perform at least one shifting operation on the first output bits to produce a plurality of second output bits, each of said at least one shifting operation being selectable from two shifting operations, a different one of the shift control bits being used to select each of said at least one shifting operation performed by the second shifter element. A third shifter element may be configured to perform one of two shifting operations on the second output bits, a second one of the shift control bits being used to select the shifting operation performed by the third shifter element.

32 Claims, 3 Drawing Sheets

HIGH SPEED SHIFTER CIRCUIT

BACKGROUND

1. Field

The present disclosure relates generally to digital circuits, and more specifically, to high speed shifter circuits for digital applications.

2. Background

Digital systems are used extensively today in almost every electronic application. These digital systems may be thought of as switching networks constructed with an array of combinational and/or sequential circuits. One type of sequential circuit that is commonplace in digital systems is the shift register. The shift register is generally constructed from a serial arrangement of storage elements and can shift binary information in one or both directions.

Many digital applications require nothing more than a simple shift register that is capable of shifting the input one bit at a time. However, in some applications, it is desirable to shift the input an arbitrary number of bits in a single operation. For these applications, combinational circuits have be used in place of the traditional shift register. These combinational circuits include logarithmic and barrel shifters, which tend to be slow, require an immense amount of hardware, and consume an inordinate amount of power.

Accordingly, there is need for a shifter circuit that can shift binary information by any number of bits in single operation. The shifter circuit should be relatively fast with less hardware and reduced power consumption than traditional barrel and logarithmic shifters.

SUMMARY

In one aspect of the present invention, a shifter circuit is capable of shifting a plurality of input data bits to the left or right by a number of bit positions as a function of a binary value of a plurality of shift control bits. The shifter circuit includes a first shifter element configured to perform one of two shifting operations on the input data bits to produce a plurality of first output bits, a first one of the shift control bits being used to select the shifting operation performed by the first shifter element. The shifter circuit also includes a second shifter element configured to perform at least one shifting operation on the first output bits to produce a plurality of second output bits, each of said at least one shifting operation being selectable from two shifting operations, a different one of the shift control bits being used to select each of said at least one shifting operation performed by the second shifter element. The shifter circuit further includes a third shifter element configured to perform one of two shifting operations on the second output bits, a second one of the shift control bits being used to select the shifting operation performed by the third shifter element.

In another aspect of the present invention, a shifter circuit is capable of shifting a plurality of input data bits to the left or right by a number of bit positions as a function of a binary value of a plurality of shift control bits. The shifter circuit includes first shifting means for performing one of two shifting operations on the input data bits to produce a plurality of first output bits, a first one of the shift control bits being used to select the shifting operation performed by the first shifting means. The shifter circuit also includes second shifting means for performing at least one shifting operation on the first output bits to produce a plurality of second output bits, each of said at least one shifting operation being selectable from two shifting operations, a different one of the shift control bits being used to select each of said at least one shifting operation performed by the second shifting means. The shifter circuit further includes third shifting means for performing one of two shifting operations on the second output bits, a second one of the shift control bits being used to select the shifting operation performed by the third shifting means.

In a further aspect of the present invention, a method is used to shift a plurality of input data bits to the left or right by a number of bit positions as a function of a binary value of a plurality of shift control bits. The method includes performing a shifting operation on the input data bits to produce a plurality of first output bits, and using a first one of the shift control bits to select, from two shifting operations, the shifting operation performed on the input data bits. The method also includes performing at least one shifting operation on the first output bits to produce a plurality of second output bits, and using a different one of the shift control bits to select, from two shifting operations, each of said at least one shifting operation performed on the first output bits. The method further includes performing a shifting operation on the second output bits, and using a second one of the shift control bits to select, from two shifting operations, the shifting operation performed on the second output bits.

It is understood that other embodiments of the present invention will become readily apparent to those skilled in the art from the following detailed description, wherein it is shown and described various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. Each embodiment described in this disclosure is provided merely as an example or illustration of the present invention, and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention. Acronyms and other descriptive terminology may be used merely for convenience and clarity and are not intended to limit the scope of the invention.

Figure 1:
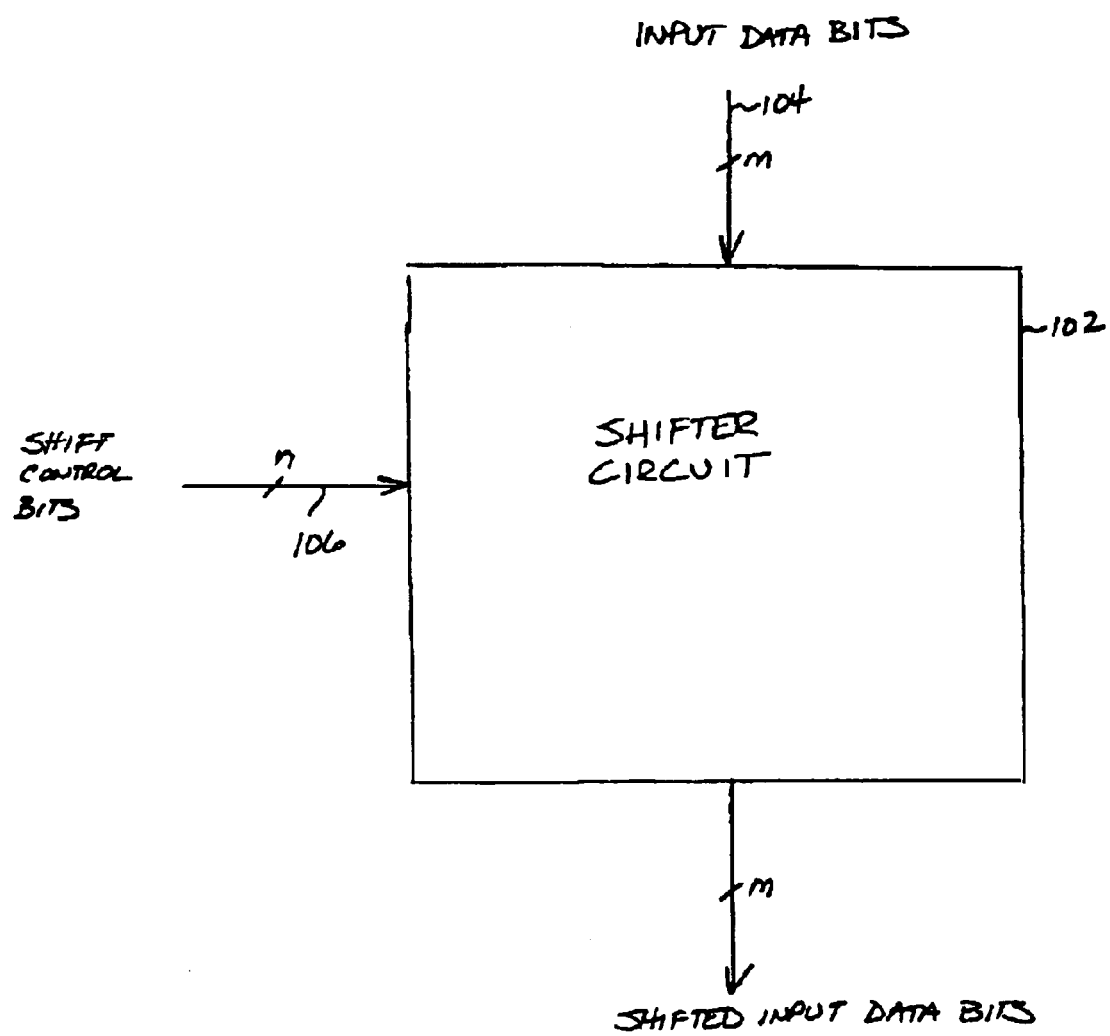
FIG. 1 is a conceptual block diagram of a shifter circuit.

A conceptual block diagram of novel m-bit shifter circuit is shown in FIG. 1, where m is the number of input data bits. The shifter circuit 102 may be a combinational circuit that shifts the input data bits 104 left or right by a number of bit positions specified by a binary value defined by n shift control lines 106. The n shift control bits may be in twos complement form. Depending on the n shift control bits, the input data bits may be shifted in one direction up to $2^{(n-1)}$ bit positions or shifted in the other direction up to $(2^{(n-1)}-1)$ bit positions. By way of example, in a shifter circuit controlled by 5 shift control bits, the input data bits may be shifted to the right up to 16 bit positions and shifted to the left up to 15 bit positions. The relationship between the shift control bits and the shifting operation performed by the shifter circuit 102 may be defined by the designer. One example of this relationship is shown in Table 1 below.

TABLE 1

| Shift Control Bits | | | | | |
| --- | --- | --- | --- | --- | --- |
| $a_4$ | $a_3$ | $a_2$ | $a_1$ | $a_0$ | Operation |
| 1 | 0 | 0 | 0 | 0 | Right shift by sixteen bit positions |
| 1 | 0 | 0 | 0 | 1 | Right shift by fifteen bit positions |
| 1 | 0 | 0 | 1 | 0 | Right shift by fourteen bit positions |
| 1 | 0 | 0 | 1 | 1 | Right shift by thirteen bit positions |
| 1 | 0 | 1 | 0 | 0 | Right shift by twelve bit positions |
| 1 | 0 | 1 | 0 | 1 | Right shift by eleven bit positions |
| 1 | 0 | 1 | 1 | 0 | Right shift by ten bit positions |
| 1 | 0 | 1 | 1 | 1 | Right shift by nine bit positions |
| 1 | 1 | 0 | 0 | 0 | Right shift by eight bit positions |
| 1 | 1 | 0 | 0 | 1 | Right shift by seven bit positions |
| 1 | 1 | 0 | 1 | 0 | Right shift by six bit positions |
| 1 | 1 | 0 | 1 | 1 | Right shift by five bit positions |
| 1 | 1 | 1 | 0 | 0 | Right shift by four bit positions |
| 1 | 1 | 1 | 0 | 1 | Right shift by three bit positions |
| 1 | 1 | 1 | 1 | 0 | Right shift by two bit positions |
| 1 | 1 | 1 | 1 | 1 | Right shift by one bit position |
| 0 | 0 | 0 | 0 | 0 | No shift |
| 0 | 0 | 0 | 0 | 1 | Left shift by one bit position |
| 0 | 0 | 0 | 1 | 0 | Left shift by two bit positions |
| 0 | 0 | 0 | 1 | 1 | Left shift by three bit positions |
| 0 | 0 | 1 | 0 | 0 | Left shift by four bit positions |
| 0 | 0 | 1 | 0 | 1 | Left shift by five bit positions |
| 0 | 0 | 1 | 1 | 0 | Left shift by six bit positions |
| 0 | 0 | 1 | 1 | 1 | Left shift by seven bit positions |
| 0 | 1 | 0 | 0 | 0 | Left shift by eight bit positions |
| 0 | 1 | 0 | 0 | 1 | Left shift by nine bit positions |
| 0 | 1 | 0 | 1 | 0 | Left shift by ten bit positions |
| 0 | 1 | 0 | 1 | 1 | Left shift by eleven bit positions |
| 0 | 1 | 1 | 0 | 0 | Left shift by twelve bit positions |
| 0 | 1 | 1 | 0 | 1 | Left shift by thirteen bit positions |
| 0 | 1 | 1 | 1 | 0 | Left shift by fourteen bit positions |
| 0 | 1 | 1 | 1 | 1 | Left shift by fifteen bit positions |

In Table 1, the absolute value of the binary value of the shift control bits is equal to the number of bit positions that the input data bits are shifted. If the binary value of the shift control bits is a negative number, then a right shift operation is performed. If the binary value of the shift control bits is a positive non-zero number, then a left shift operation is performed.

The binary value of the shift control bits may be represented by the following equation:

$$\sum_{i=o}^{n-2} a_i \cdot 2^i + (-1)^{a_{n-1}} \cdot 2^{n-1} \quad (1)$$

where: $a_i$ is the $i^{th}$ shift control bit; and
n is the number of shift control bits.

Equation (1) may be rewritten as:

$$(-1)^{a_{n-1}} \cdot 2^{n-2} + \left[\sum_{i=1}^{n-2} (2a_i - 1) \cdot 2^{(i-1)}\right] + a_o - 1 \quad (2)$$

Equation (2) has three components:

$$a_o - 1 \quad (1)$$

$$\sum_{i=1}^{n-2} (2a_i - 1) \cdot 2^{(i-1)} \quad (2)$$

$$(-1)^{a_{n-1}} \cdot 2^{n-2} \quad (3)$$

Figure 2:
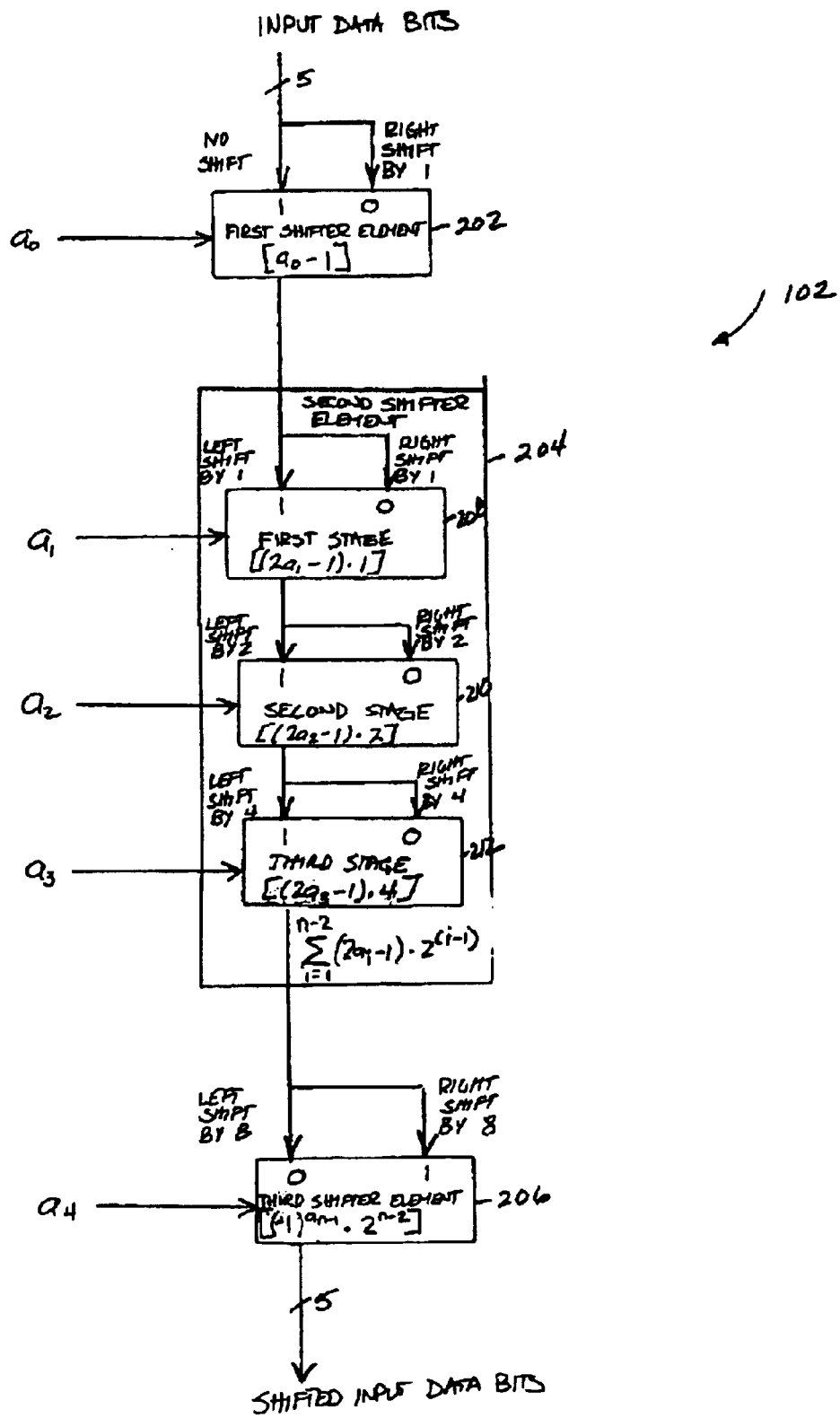
FIG. 2 is a conceptual block diagram of a shifter circuit implemented with three shifter elements.

These components may be implemented in a three-stage shifter circuit as shown in FIG. 2. The shifter circuit 102 may have a first shifter element 202 implementing the first component of equation (2), a second shifter element 204 implementing the second component of equation (2), and a third shifter element 206 implementing the third component of equation (2). Each shifter element may be used to perform a shifting operation in accordance with Table 1 independent of the shifting operations performed by the other shifter elements.

The following example is illustrative of this approach. Table 1 calls for the input data bits to be shifted left by six bit positions when the shift control bits are "00110." The same result may be obtained by combining three separate shift operations in accordance with equation (2). The first component may be solved by substituting "0" for $a_0$. The computation result is "−1", which according to Table 1, requires the input data bits to be shifted by one bit position to the right. The second component may be solved by substituting "0" for $a_3$, "1" for $a_2$, and "1" for $a_1$. The computational result is "−1", which according to Table 1, requires the input data bits to be shifted by one more bit position to the right. Finally, the third component may be solved by substituting "0" for $a_4$. The computational result is "8", which according to Table 1, requires the input data bits be shifted eight bit positions to the left. Accordingly, if the input data bits are shifted twice to the right by one bit position and then shifted to the left by eight bit positions, the result is that the input data bits are shifted to the left by six bit positions.

Returning to FIG. 2, the first shifter element 202 may be used to implement $[(a_0-1)]$. If $a_0$ is equal to "0", then the computational result is "−1", which according to Table 1, requires the input data bits to be shifted to the right by one bit position. If $a_0$ is equal to "1", then the computational result is "0", which according to Table 1, is a no shift operation. Thus, the first shifter element 202 may be implemented to shift the input data bits to the right by one bit position if $a_0$ is equal to "0", and to perform a no shift operation if $a_0$ is equal to "1".

The second shifter element 204 may be used to implement $$\left[\sum_{i=1}^{n-2} (2a_i - 1) \cdot 2^{(i-1)}\right].$$

The shifter circuit 102, the second shifter element 204 may include (n−2) stages. The I stage of the second shifter element may be used to perform either a right shift or a left shift by $2^{(i-1)}$ bit positions depending on the value of $a_i$.

As an illustrative example, the second shifter element 204 is shown in FIG. 2 for a 5-bit shifter circuit. This second shifter element 204 has three stages. The first stage 208 may be used to compute the second component of equation (2) with i equal to "1", the second stage 210 may be used to compute the second component of equation (2) with i equal to "2", and the third stage 212 may be used to compute the second component of equation (2) with i equal to (n−2) or "3".

The computational result of the first stage 208 with $a_1$ equal to "0" is "−1", which according to Table 1, requires a right shift operation by one bit position. The computational result of the first stage 208 with $a_1$ equal to "1" is "1", which according to Table 1, requires a left shift operation by one bit position. Thus, the first stage 208 may be implemented to perform a shift right operation by one bit position if $a_1$ is equal to "0", and to perform a shift left operation by one bit position if a, is equal to "1".

The computational result of the second stage 210 with $a_2$ equal to "0" is "−2", which according to Table 1, requires a right shift operation by two bit positions. The computational result of the second stage 208 with $a_2$ equal to "1" is "2", which according to Table 1, requires a left shift operation by two bit positions. Thus, the second stage 210 may be implemented to perform a shift right operation by two bit positions if $a_2$ is equal to "0", and to perform a shift left operation by two bit positions if $a_2$ is equal to "1".

The computational result of the third stage 212 with $a_3$ equal to "0" is "−4", which according to Table 1, requires a right shift operation by four bit positions. The computational result of the third stage 212 with $a_3$ equal to "1" is "4", which according to Table 1, requires a left shift operation by four bit positions. Thus, the third stage 212 may be implemented to perform a shift right operation by four bit positions if $a_3$ is equal to "0", and to perform a shift left operation by four bit positions if $a_3$ is equal to "1".

The third shifter element 206 may be used to implement $[(-1)^{a_{n-1}} \cdot 2^{n-2}]$. In the illustrative example of FIG. 2, the third shifter element 206 is shown for a 5-bit shifter circuit. In this example, if $a_4$ is equal to "0", then the computational result is "8", which according to Table 1, requires a left shift operation by eight bit position. If $a_4$ is equal to "1", then the computational result is "−8", which according to Table 1, requires a right shift operation by eight bit positions. Thus, the third shifter element 206 may be implemented to perform a left shift operation by eight bit positions if $a_4$ is equal to "0", and to perform a right shift operation by eight bit positions if $a_4$ is equal to "1". Generally speaking, the third shifter element 206 may be implemented to perform a right or left shift operation by $2^{(n-2)}$ bit positions depending on the value of $a_{n-1}$.

Each shifter element in the shifter circuit 102 may be implemented in a variety of ways. By way of example, programmable logic may be used to implement the shifting operations. Suitable programmable logic devices include programmable gate arrays (FPGA), ROM memory, RAM memory, flash memory, EPROM memory, EEPROM memory, CD-ROM, and the like. Hardware implementations include discrete gate logic, transistor logic, and the like. In at least one embodiment of the shifter circuit 102, an arrangement of multiplexer circuits may be used as shown in FIG. 3.

Figure 3:
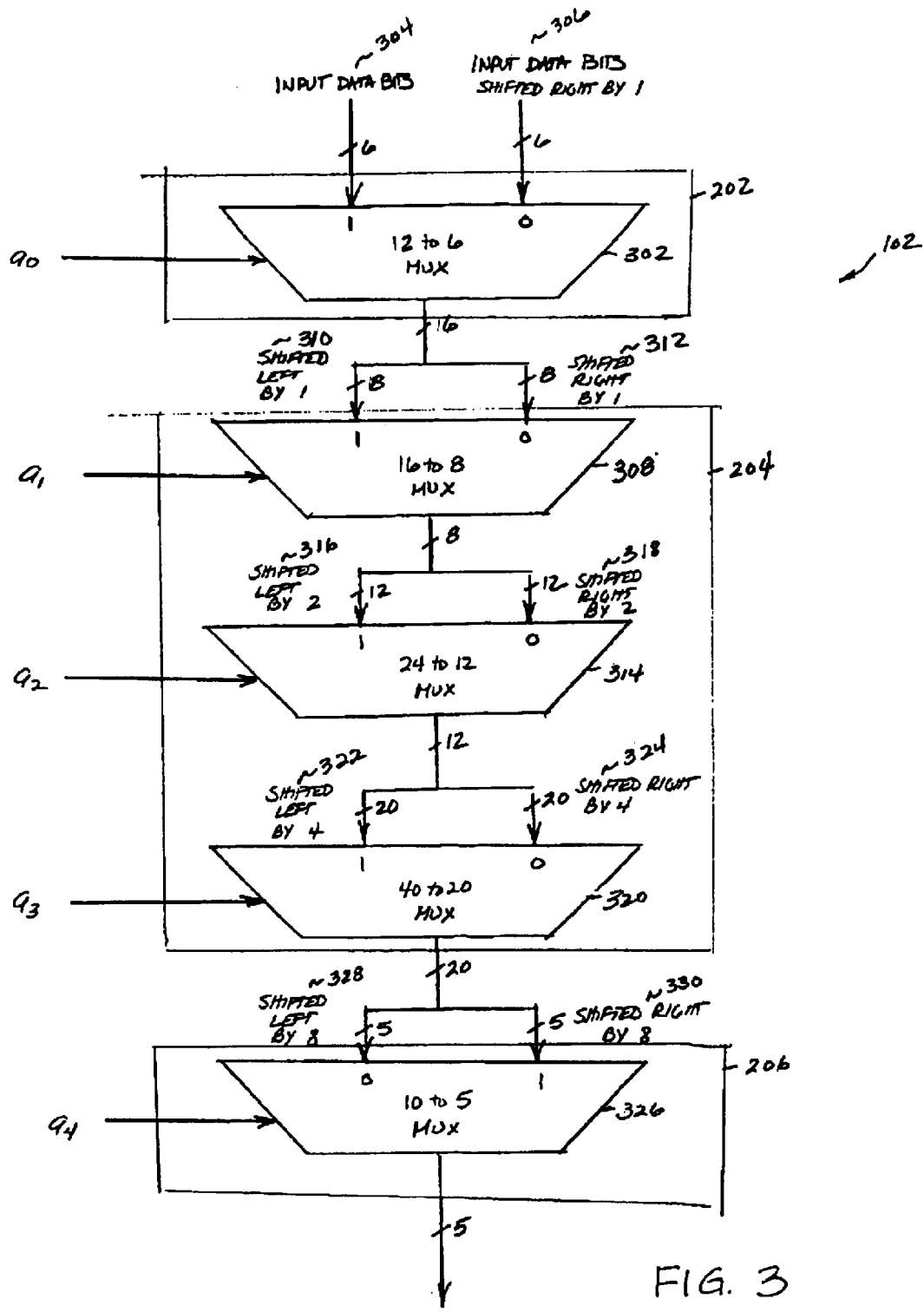
FIG. 3 is a conceptual block diagram of a shifter circuit implemented with an arrangement of multiplexers.

Referring to FIG. 3, a first multiplexer circuit 302 may be used to implement the first shifter element 202. The first multiplexer circuit 302 may be implemented with (m+1) 2:1 multiplexers. In this configuration, one 2:1 multiplexer is used for each input data bit with an extra 2:1 multiplexer to retain the Least Significant Bit (LSB) of the input data bits should a shift right operation be called for by the shift control bit $a_0$. In the embodiment shown in FIG. 3, six 2:1 multiplexers may be used to implement the first shifter element 202 of the shifter circuit 102. For simplicity of illustration, the six 2:1 multiplexers are represented as a 12:6 multiplexer circuit.

The input data bits 304 provided to the input of the first multiplexer circuit 302 includes the 5-input data bits in the 5 most significant bit positions and a "0" in the least significant bit position. The shifted input data bits 306 provided to the input to the first multiplexer circuit 302 includes the 5-input data bits in the 5 least significant bit positions with the sign bit extended left into the most significant bit position.

A second multiplexer circuit 308 may be used to implement the first stage 208 of the second shifter element 204. The 6-bit output from the first multiplexer circuit 302 may be applied to the input of the second multiplexer circuit 304 such that the 6-bits are shifted to the right by one bit position if the shift control bit $a_1$ is "0" or shifted to the left by one bit position of the shift control bit $a_1$ is "1". The second multiplexer circuit 308 may be implemented with six 2:1 multiplexers, one for each of the 6-bits output from the first multiplexer circuit 302. Two additional 2:1 multiplexers, one on each side, may be used to retain the LSB in connection with two left shift operations, or to retain the MSB in connection with a no-shift operation followed by a left shift operation. Thus, the second multiplexer circuit 308 is represented as a 16:8 multiplexer circuit.

The shifted data bits 310 provided to the input of the second multiplexer circuit 308 includes the 6-bit output from the first multiplexer circuit 302 in the six most significant bit positions and "00" in the two least significant bit positions. The shifted data bits 312 provided to the input to the second multiplexer circuit 308 includes the 6-bit output from the first multiplexer circuit 302 in the six least significant bit positions with the sign bit extended left into the two most significant bit positions.

A third multiplexer circuit 314 may be used to implement the second stage 210 of the second shifter element 204. The 8-bit output from the second multiplexer circuit 308 may be applied to the input of the third multiplexer circuit 314 such that the 8-bits are shifted to the right by two bit positions if the shift control bit $a_2$ is "0" and shifted to the left by two bit positions if the shift control bit $a_2$ is "1". The third multiplexer circuit 314 may be implemented with eight 2:1 multiplexers, one for each of the 8-bits output from the second multiplexer circuit 304. Four additional 2:1 multiplexers, two on each side, may be used to retain the LSB and the MSB under all possible shift operations. Thus, the third multiplexer circuit 314 is represented as a 24:12 multiplexer circuit.

The shifted data bits 316 provided to the input of the third multiplexer circuit 314 includes the 8-bit output from the second multiplexer circuit 308 in the eight most significant bit positions and "0000" in the four least significant bit positions. The shifted data bits 318 provided to the input to the third multiplexer circuit 314 includes the 8-bit output from the second multiplexer circuit 308 in the eighth least significant bit positions with the sign bit extended left into the four most significant bit positions.

A fourth multiplexer circuit 320 may be used to implement the third stage 212 of the second shifter element 204. The 12-bit output from the third multiplexer circuit 314 may be applied to the input of the fourth multiplexer circuit 320 such that the 12-bits are shifted to the right by four bit positions if the shift control bit $a_3$ is "0" and shifted to the left by four bit positions if the shift control bit $a_3$ is "1". The fourth multiplexer circuit 320 may be implemented with twelve 2:1 multiplexers, one for each of the 12-bits output from the third multiplexer circuit 314. Eight additional 2:1 multiplexers, four on each side, may be used to retain the LSB and the MSB under all possible shift conditions. Thus, the fourth multiplexer circuit 320 is represented as a 40:20 multiplexer circuit.

The shifted data bits 322 provided to the input of the fourth multiplexer circuit 320 includes the 12-bit output from the third multiplexer circuit 314 in the twelve most significant bit positions and "00000000" in the eight least significant bit positions. The shifted data bits 324 provided to the input to the fourth multiplexer circuit 320 includes the 12-bit output from the third multiplexer circuit 314 in the eight least significant bit positions with the sign bit extended left into the eight most significant bit positions.

A fifth multiplexer circuit 326 may be used to implement the third shifter element 206. The 20-bit output from the fourth multiplexer circuit 320 may be applied to the inputs of the fifth multiplexer circuit 326 such that the 20-bits are shifted to the left by eight bit positions if the shift control bit $a_4$ is "0" and shifted to the right by eight bit positions if the shift control bit $a_4$ is "1". A 5-bit output may then be extracted from the fifth multiplexer circuit 326.

The shifted data bits 328 provided to the input of the fifth multiplexer circuit 326 is the $17^{th}$ to $21^{th}$ least significant bit positions of the binary number created by placing the 20-bit output from the fourth multiplexer circuit 320 in the twenty most significant bit positions and "0000000000000000" in the sixteen least significant bit positions. The shifted data bits 330 provided to the input of the fifth multiplexer circuit 326 is the $17^{th}$ to $21^{th}$ least significant bit positions of the binary number created by placing the 20-bit output from the fourth multiplexer circuit 320 in the twenty least significant bit positions with the sign bit extended left into the sixteen most significant bit positions.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A shifter circuit capable of shifting a plurality of input data bits to the left or right by a number of bit positions as a function of a binary value of a plurality of shift control bits, comprising:
   a first shifter element configured to perform one of only two possible shifting operations on the input data bits to produce a plurality of first output bits, a first one of the shift control bits being used to select the shifting operation performed by the first shifter element;
   a second shifter element configured to perform at least one shifting operation on the first output bits to produce a plurality of second output bits, each of said at least one shifting operation being selectable from only two possible shifting operations, a different one of the shift control bits being used to select each of said at least one shifting operation performed by the second shifting element; and
   a third shifter element configured to perform one of only two possible shifting operations on the second output bits, a second one of the shift control bits being used to select the shifting operation performed by the third shifter element.

2. The shifter circuit of claim 1 wherein the two shifting operations of the first element comprises a no-shift operation and a right shift operation by one bit position.

3. The shifter circuit of claim 2 wherein the first one of the shift control bits comprises the least significant bit, and wherein the first shifter element is further configured to perform the no-shift operation if the first one of the shift control bits is one and perform the right shift operation if the first one of the shift control bits is zero.

4. The shifter circuit of claim 1 wherein the shift control bits comprise n bits, and wherein the second shifter element comprises (n−2) serial stages, each of the (n−2) stages being configured to perform one of said at least one shifting operation.

5. The shifter circuit of claim 4 wherein an i stage of the (n−2) stages is configured to perform a right or left shift operation by $2^{(i-1)}$ bit positions, where ($1 \leq i \leq (n-2)$).

6. The shifter circuit of claim 5 wherein the i stage of the (n−2) stages is configured to perform the left shift operation if its corresponding shift control bit is one and perform the right shift operation if its corresponding shift control bit is zero.

7. The shifter circuit of claim 1 wherein the shift control bits comprise n bits, and wherein the two shifting operations of the third shifter element comprise a right and left shift operation each by $2^{(n-2)}$ bit positions.

8. The shifter circuit of claim 7 wherein the second one of the shift control bits comprises the most significant bit, and wherein the third shifter element is further configured to perform the left shift operation if the second one of the shift control bits is zero and perform the right shift operation if the second one of the shift control bits is one.

9. The shifter circuit of claim 1 wherein the first and second shifter elements are each conned to retain all the input data bits for any combination of shift operations.

10. The shifter circuit of claim 1 wherein the shift control bits comprise n bits, and wherein the first and third shifter elements each comprises a multiplexer circuit, a the second shifter element comprises a serial arrangement of (n−2) multiplexer circuits.

11. The shifter circuit of claim 10 wherein the input data bits comprise m bits, and wherein each of the multiplexer circuits comprises at least m parallel multiplexes.

12. The shifter circuit of claim 10 wherein the input data bits comprise m bits, and wherein the multiplexer circuit for the first shifter element comprises (m+1) parallel multiplexers.

13. The shifter cut of claim 12 wherein the i multiplexer circuit of the serial arrangement of (n−2) multiplexer circuits comprises a plurality of parallel multiplexers equal to $2^i$ multiplexers plus the number of parallel multiplexers from which it receives its inputs, where ($1 \leq i \leq (n-2)$).

14. A shifter circuit capable of shifting a plurality of input data bits to the left or right by a number of bit positions as a function of a binary value of a plurality of shift control bits, comprising:
   first shifting means for performing one of only two possible shifting operations on the input data bits to produce a plurality of first output bits, a first one of the shift control bits being used to select the shifting operation performed by the first shifting means;
   second shifting means for performing at least one shifting operation on the first output bits to produce a plurality of second output bits, each of said at least one shifting operation being selectable from only two possible shifting operations, a different one of the shift control bits being used to select each of said at least one shifting operation performed by the second shifting means; and third shifting means for performing one of only two possible shifting operations on the second output bits, a second one of the shift control bits being used to select the shifting operation performed by the third shifting means.

15. The shifter circuit of claim 14 wherein the two shifting operations of the first shifter element comprises a no-shift operation and a right shift operation by one bit position.

16. The shifter circuit of claim 15 wherein the first one of the shift control bits comprises the least significant bit, and wherein the first shifting means is further configured to perform the no-shift operation if the first one of the shift control bits is one and perform the right shift operation if the first one of the shift control bits is zero.

17. The shifter circuit of claim 14 wherein the shift control bits comprise n bits, and wherein the second shifting means comprises (n−2) serial stages, each of the (n−2) stages being configured to perform one of said at least one shifting operation.

18. The shifter circuit of claim 17 wherein an i stage of the (n−2) stages is configured to perform a right or left shift operation by $2^{(i-1)}$ bit positions, where ($1 \leq i \leq (n-2)$).

19. The shifter circuit of claim 18 wherein the an i stage of the (n−2) stages is configured to perform the left shift operation if its corresponding shift control bit is one and perform the right shift operation if its corresponding shift control bit is zero.

20. The shifter circuit of claim 14 wherein the shift control bits comprise n bits, and wherein the two shifting operations of the third shifting comprise a right and left shift operation each by $2^{(i-2)}$ bit positions.

21. The shift circuit of claim 20 wherein the second one of the shift control bits comprises the most significant bit, and wherein the third shifter element is further configured to perform the left shift operation if the second one of the shift control bits is zero and perform the right shift operation if the second one of the shift control bits is one.

22. A method of shifting a plurality of input data bits to the left or right by a number of bit positions as a function of a binary value of a plurality of shift control bits, comprising:

performing a shifting operation on the input data bits to produce a plurality of first output bits, and using a first one of the shift control bits to select, from only two possible shifting operations, the shifting operation performed on the input data bits;

performing at least one shifting operation on the first output bits to produce a plurality of second output bits, and using a different one of the shift control bits to select, from only two possible shifting operations, each of said at least one shifting operation performed on the first output bits; and performing a shifting operation on the second output bits, and using a second one of the shift control bits to select, from only two possible shifting operations, the shifting operation performed on the second output bits.

23. The method of claim 22 wherein the two shifting operations from which the shifting operation performed on the input data bits is selected comprises a no-shift operation and a right shift operation by one bit position.

24. The method of claim 23 when the first one of the shift control bits comprises the least significant bit, and wherein the shifting operation performed on the input data bits is the no-shift operation if first one of the shift control bits is one.

25. The method of claim 23 wherein the first one of the shift control bits comprises the least significant bit, and wherein the shifting operation performed on the input data bits is the right shift operation if the first one of the shift control bits is zero.

26. The method of claim 22 wherein the shift control bits comprise n bits, and wherein the at least one shifting operation performed on the first output bits is performed by (n−2) serial stages, each of the (n−2) stages performs one of said at least one shifting operation.

27. The method of claim 26 wherein an i stage of the (n−2) stages perform a right or left shift operation by $2^{(i-1)}$ bit positions, where ($1 \leq i \leq (n-2)$).

28. The method of claim 27 wherein the an i stage of the (n−2) stages performs the left shift operation if its corresponding shift control bit is one.

29. The method of claim 27 wherein the an i stage of the (n−2) stages performs the right shift option if its corresponding shift control bit is zero.

30. The method of claim 22 wherein the shift control bits comprise n bits, and wherein the two shifting operations from which the shifting operation performed on the second output bits is selected comprises a right and left shift operation each by $2^{(n-2)}$ bit positions.

31. The method of claim 30 wherein the second one of the shift control bits comprises the most significant bit, and wherein the shifting operation performed on the second output bits is the left shift operation if the second one of the shift control bits is zero.

32. The method of claim 30 wherein the second one of the shift control bits comprises the most significant bit, and wherein the shifting operation performed on the second output bits is the right shift operation if the second one of the shift control bits is one.

* * * * *

UNITED STATES PATENT AND TRADEMARK OFFICE
CERTIFICATE OF CORRECTION

PATENT NO. : 6,853,699 B1
DATED : February 8, 2005
INVENTOR(S) : Sumant Ramprasad It is certified that error appears in the above-identified patent and that said Letters Patent is hereby corrected as shown below:

Title page,
Item [74], please replace with:
-- [74] *Attorney, Agent, or Firm* - Philip R. Wadsworth; Charles D. Brown; Nicholas J. Pauley --.

Signed and Sealed this

Sixteenth Day of August, 2005

JON W. DUDAS
*Director of the United States Patent and Trademark Office*